United States Patent
Tsai et al.

(10) Patent No.: US 9,153,574 B2
(45) Date of Patent: Oct. 6, 2015

(54) SEMICONDUCTOR DEVICE AND METHOD OF FABRICATING THE SAME

(71) Applicant: MACRONIX International Co., Ltd., Hsinchu (TW)

(72) Inventors: Ying-Chieh Tsai, Hsinchu (TW); Wing-Chor Chan, Hsinchu (TW); Jeng Gong, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/140,291

(22) Filed: Dec. 24, 2013

(65) Prior Publication Data

US 2015/0179631 A1  Jun. 25, 2015

(51) Int. Cl.

| | |
|---|---|
| *H01L 21/70* | (2006.01) |
| *H01L 21/8238* | (2006.01) |
| *H01L 27/06* | (2006.01) |
| *H01L 29/10* | (2006.01) |
| *H01L 29/06* | (2006.01) |
| *H01L 29/40* | (2006.01) |
| *H01L 29/66* | (2006.01) |

(52) U.S. Cl.
CPC ........ *H01L 27/0623* (2013.01); *H01L 29/0642* (2013.01); *H01L 29/1004* (2013.01); *H01L 29/1095* (2013.01); *H01L 29/402* (2013.01); *H01L 29/66325* (2013.01); *H01L 27/0652* (2013.01); *H01L 27/0658* (2013.01); *H01L 27/0664* (2013.01)

(58) Field of Classification Search
CPC ............ H01L 27/0623; H01L 27/0652; H01L 27/0658; H01L 27/0664; H01L 27/067; H01L 27/0711; H01L 27/0722; H01L 29/1095; H01L 29/66325
See application file for complete search history.

(56) References Cited

U.S. PATENT DOCUMENTS

| | | | | |
|---|---|---|---|---|
| 2010/0032713 | A1* | 2/2010 | Kawahara et al. | 257/141 |
| 2011/0309442 | A1* | 12/2011 | Grote et al. | 257/339 |
| 2012/0217581 | A1* | 8/2012 | Kondou | 257/337 |

FOREIGN PATENT DOCUMENTS

| | | |
|---|---|---|
| CN | 101110445 | 1/2008 |
| TW | 201251007 | 12/2012 |

OTHER PUBLICATIONS

"Office Action of Taiwan Counterpart Application", issued on Aug. 4, 2015, p. 1-p. 10.

* cited by examiner

*Primary Examiner* — Su C Kim
(74) *Attorney, Agent, or Firm* — J.C. Patents

(57) ABSTRACT

Provided is a semiconductor device including a deep doped region of a first conductivity type, a well region of a second conductivity type, a base region of the first conductivity type, an insulated gate bipolar transistor (IGBT) and a metal oxide semiconductor (MOS). The well region is disposed in the deep doped region. The base region is disposed in the well region and is not connected to the deep doped region. The IGBT is disposed on the well region at the first side of the base region, and includes a first doped region of the second conductivity type disposed in the base region. The MOS is disposed on the well region and the deep well region at the second side of the base region, and includes a second doped region of the second conductivity type disposed in the base region.

20 Claims, 6 Drawing Sheets

SEMICONDUCTOR DEVICE AND METHOD OF FABRICATING THE SAME

BACKGROUND OF THE INVENTION

1. Field of Invention

The present invention relates to a semiconductor device and a method of fabricating the same.

2. Description of Related Art

The latest technology development focuses on high-voltage power integrated circuits. Such high-voltage power integrated circuits can be applied to fields such as switching mode power supply (SMPS), lighting, motor control or plasma display drivers, so as to enhance efficiency, reliability and flexibility of products and ultimately reduce the system-level cost.

Generally, the high-voltage power integrated circuits are mainly applied to power switch devices for providing power management apparatuses with power switch functions. Two parameters of breakdown voltage and on-state resistance influence the market of power switch devices and can be determined upon different needs. The designs of high-voltage power integrated circuits are for reducing on-state resistance while maintaining high breakdown voltage. In fact, a product usually meets the breakdown voltage specification requirement at the expense of on-state resistance. In other words, the breakdown voltage and on-state resistance are in a trade-off relationship.

SUMMARY OF THE INVENTION

The present invention provides a semiconductor device and a method of fabricating the same. The semiconductor device can be formed with a lower on-state resistance and a higher breakdown voltage.

The present invention provides a semiconductor device including a deep doped region of a first conductivity type, a first well region of a second conductivity type, a base region of the first conductivity type, an insulated gate bipolar transistor (IGBT) and a metal oxide semiconductor (MOS). The deep doped region includes a first buried layer and two high-voltage doped regions and is disposed in a substrate. The first well region is disposed in the deep doped region. The base region is disposed in the first well region and is not connected to the deep doped region. The IGBT is disposed on the first well region at a first side of the base region, and includes a first doped region of the second conductivity type disposed in the base region. The MOS is disposed on the first well region and the deep well region at a second side of the base region, and includes a second doped region of the second conductivity type disposed in the base region.

According to an embodiment of the present invention, the semiconductor device further includes a second buried layer of the second conductivity type disposed between the first buried layer and the substrate.

According to an embodiment of the present invention, the semiconductor device further includes a second well region of the second conductivity type disposed in the first well region, wherein the base region is located in the second well region.

According to an embodiment of the present invention, the IGBT further includes: an isolation structure, disposed in the first well region; a gate structure, disposed on the first well region at a first side of the isolation structure, covering a portion of the isolation structure and a portion of the base region, and located adjacent to the first doped region; a third doped region of the first conductivity type, disposed in the first well region at a second side of the isolation structure; a fourth doped region of the second conductivity type, disposed in the first well region between the third doped region and the isolation structure and contacting the third doped region; and a top doped region of the first conductivity type, disposed below the isolation structure.

According to an embodiment of the present invention, the top doped region extends from below the isolation structure to below the fourth doped region and contacts the fourth doped region.

According to an embodiment of the present invention, the top doped region extends from below the isolation structure to below the third doped region and contacts the third and fourth doped regions.

According to an embodiment of the present invention, the gate structure includes polysilicon, metal, silicide or a combination thereof.

According to an embodiment of the present invention, the semiconductor device further includes at least one field plate disposed on the isolation structure.

According to an embodiment of the present invention, the field plate includes polysilicon, metal, silicide or a combination thereof.

According to an embodiment of the present invention, the first conductivity type is N-type and the second conductivity type is P-type, or the first conductivity type is P-type and the second conductivity type is N-type.

The present invention further includes a method of fabricating a semiconductor device. A deep doped region of a first conductivity type is formed in a substrate, wherein the deep doped region includes a first buried layer and two high-voltage doped regions. A first well region of a second conductivity type is formed in the deep doped region. A base region of the first conductivity type is formed in the first well region, wherein the base region is not connected to the deep doped region. An insulated gate bipolar transistor (IGBT) is formed on the first well region at a first side of the base region. The step of forming the IGBT includes forming a first doped region of the second conductivity type in the base region. A metal oxide semiconductor (MOS) is formed on the first well region and the deep well region at a second side of the base region. The step of forming the MOS includes forming a second doped region of the second conductivity type in the base region.

According to an embodiment of the present invention, the method further includes forming a second buried layer of the second conductivity type between the first buried layer and the substrate.

According to an embodiment of the present invention, the method further includes forming a second well region of the second conductivity type in the first well region, wherein the base region is located in the second well region.

According to an embodiment of the present invention, the step of forming the IGBT further includes: forming an isolation structure in the first well region; forming a gate structure on the first well region at a first side of the isolation structure, the gate structure covering a portion of the isolation structure and a portion of the base region and located adjacent to the first doped region; forming a third doped region of the first conductivity type in the first well region at a second side of the isolation structure; forming a fourth doped region of the second conductivity type in the first well region between the third doped region and the isolation structure, the fourth doped region contacting the third doped region; and forming a top doped region of the first conductivity type below the isolation structure.

According to an embodiment of the present invention, the top doped region extends from below the isolation structure to below the fourth doped region and contacts the fourth doped region.

According to an embodiment of the present invention, the top doped region extends from below the isolation structure to below the third doped region and contacts the third and fourth doped regions.

According to an embodiment of the present invention, the isolation structure includes a field oxide (FOX) structure, a shallow trench isolation (STI) structure or a deep trench isolation structure.

According to an embodiment of the present invention, the method further includes forming at least one field plate on the isolation structure.

According to an embodiment of the present invention, the field plate includes polysilicon, metal, silicide or a combination thereof.

According to an embodiment of the present invention, the first conductivity type is N-type and the second conductivity type is P-type, or the first conductivity type is P-type and the second conductivity type is N-type.

In view of the foregoing, the semiconductor device of the invention has a structure in which the base region is formed without connecting the deep doped region, so that the MOS has a channel through which the electron current generated from the MOS flows to reduce the on-state resistance. Besides, a multi-RESURF structure is created with the disposition of the well region, the buried layer and the top doped region, and thus, the breakdown voltage of the device can be enhanced.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 7 is a graph of anode current vs. anode voltage when the semiconductor device of the invention and the conventional IGBT are turned on.

DESCRIPTION OF EMBODIMENTS

Figure 1:
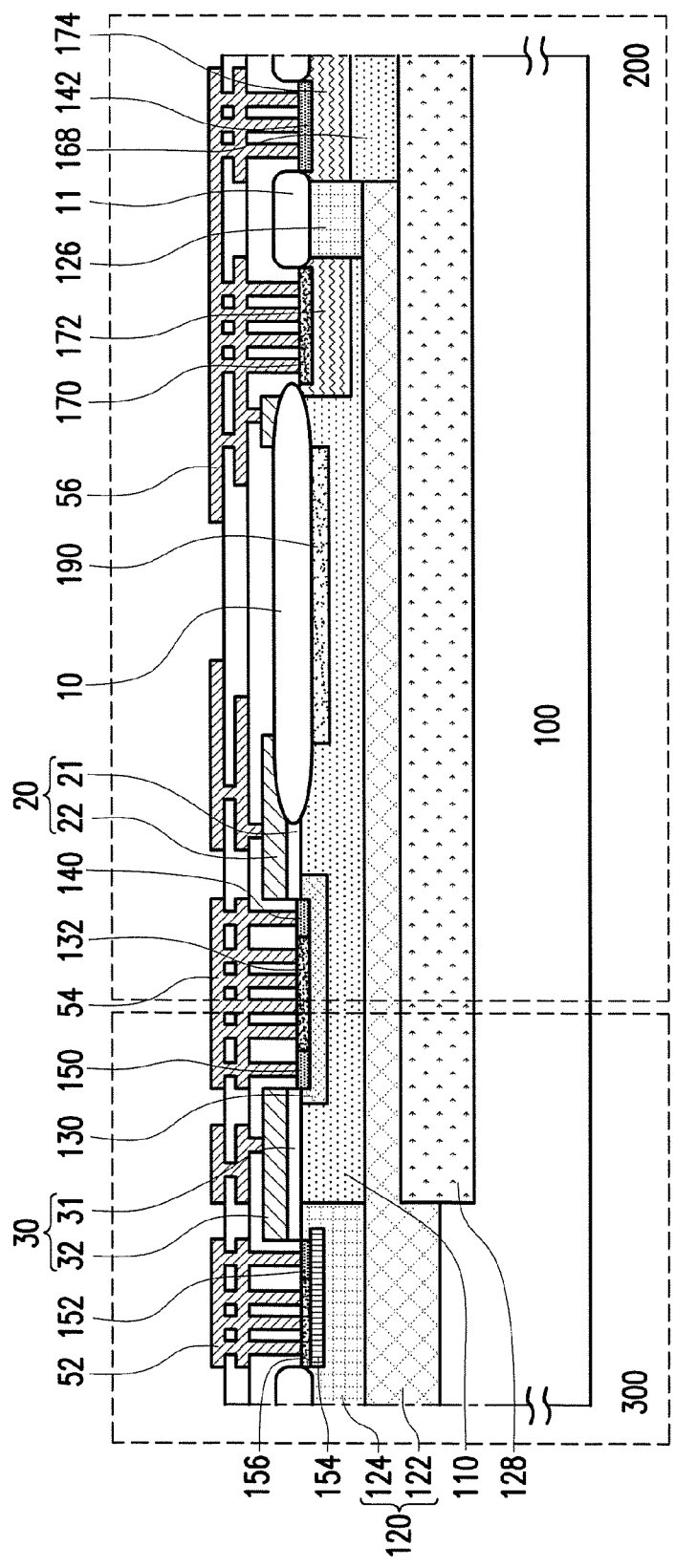
FIG. 1 is a schematic cross-sectional view of a semiconductor device according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Herein, when the first conductivity type is N-type, the second conductivity type is P-type; or when the first conductivity type is P-type, the second conductivity type is N-type. In the following embodiments in which the first conductivity type is P-type and the second conductivity type is N-type are provided for illustration purposes, and are not construed as limiting the present invention. The P-type dopant includes boron, and the N-type dopant includes phosphorous or arsenic.

FIG. 1 is a schematic cross-sectional view of a semiconductor device according to a first embodiment of the present invention.

Referring to FIG. 1, the semiconductor device of the first embodiment includes a substrate 100, an IGBT 200 and a MOS 300, a deep doped region 120 of a first conductivity type, a well region 110 of a second conductivity type and a base region of the first conductivity type 130. The IGBT 200 is disposed on the first well region 110 at the first side of the base region 130. The MOS 300 is disposed on the first well region 110 at the second side of the base region 130. The base region 130 is disposed in the first well region 110 and is not connected to the deep well region 120, so that the electron current generated by the MOS 300 can flow through the channel of the second conductivity type formed between the base region 130 and the deep doped region 120. Thus, the on-state resistance can be reduced and the on-state electron current can be increased.

The substrate 100 can be a semiconductor substrate of the first conductivity type, such as a P-type substrate. The semiconductor substrate can include at least one material selected from the group consisting of Si, Ge, SiGe, GaP, GaAs, SiC, SiGeC, InAs, and InP. The substrate can be a semiconductor-on-insulator (SOI) substrate.

The deep doped region 120 of the first conductivity type includes a first buried layer 122 (e.g. P-type barrier layer; PBL) and two high-voltage doped regions 124 and 126 (e.g. high-voltage P-type drift regions). The first buried layer 122 and the high-voltage doped regions 124 and 126 are disposed in the substrate 100.

The first well region 110 of the second conductivity type (e.g. high-voltage N-type well region) is disposed in the substrate 100. The first well region 110 can be formed with a photolithography process and an ionx implantation process. In an embodiment, the first well region 110 can be implanted with a dopant of phosphorous or arsenic, a dose of $1 \times 10^{12}/cm^2$ to $2 \times 10^{12}/cm^2$ and an energy of 140 eV to 160 eV.

The first well region 110 is disposed in the deep doped region 120. Specifically, the first buried layer 122 is disposed below and adjacent to the first well region 110. The two high-voltage doped regions 124 and 126 are disposed beside and adjacent to the first well region 110.

In an embodiment, the first buried layer 122 and the high-voltage doped regions 124 and 126 have the same doping concentration. The first buried layer 122 and the high-voltage doped regions 124 and 126 can be formed with the same photolithography process and the same ion implantation process. In an embodiment, the first buried layer 122 and the high-voltage doped regions 124 and 126 can be implanted with a dopant of boron, a dose of $1 \times 10^{13}/cm^2$ to $2 \times 10^{13}/cm^2$ and an energy of 50 eV to 70 eV.

In another embodiment, the first buried layer 122 and the high-voltage doped regions 124 and 126 have different doping concentrations. The first buried layer 122 and the high-voltage doped regions 124 and 126 can be formed with different photolithography processes and different ion implantation processes. The high-voltage doped regions 124 and 126 has a doping concentration less than that of the first buried layer 122. In an embodiment, the first buried layer 122 can be implanted with a dopant of boron, a dose of $2\times10^{13}/cm^2$ to $3\times10^{13}/cm^2$ and an energy of 60 eV to 80 eV. The high-voltage doped regions 124 and 126 can be implanted with a dopant of boron, a dose of $1\times10^{13}/cm^2$ to $2\times10^{13}/cm^2$ and an energy of 50 eV to 60 eV.

The base region 130 of the first conductivity type (e.g. P-type base region) is disposed in the first well region 110. The bottom of the base region 130 is not connected to the deep doped region 120. The base region 130 can be formed with a photolithography process and an ion implantation process. In an embodiment, the base region 130 can be implanted with a dopant of boron, a dose of $2\times10^{12}/cm^2$ to $3\times10^{12}/cm^2$ and an energy of 100 eV to 120 eV.

The semiconductor device can further include a second buried layer 128 of the second conductivity type (e.g. N-type buried layer; NBL). The second buried layer 128 is disposed between the first buried layer 122 and the substrate 100. The second buried layer 128 can be formed with a photolithography process and an ion implantation process. In an embodiment, the second buried layer 128 can be implanted with a dopant of phosphorous or arsenic, a dose of $1\times10^{12}/cm^2$ to $3\times10^{12}/cm^2$ and an energy of 240 eV to 260 eV.

The IGBT 200 is disposed on the first well region 110 at the first side of the base region 130. The IGBT 200 includes a gate structure 20, a first doped region 140 of the second conductivity type, a fifth doped region 142 of the second conductivity type, a third doped region 170 of the first conductivity type, a top doped region 190 of the first conductivity type and an isolation structure 10.

The isolation structure 10 is disposed in the first well region 110. The isolation structure 10 includes a doped or undoped silicon oxide, low-stress silicon nitride, silicon oxynitride or a combination thereof. The isolation structure 10 can be formed with a field oxide (FOX) process, a shallow trench isolation (STI) process or a deep trench isolation process. The isolation structure 10 has a thickness of 600 nm to 700 nm.

The gate structure 20 is disposed on the first well region 110 at the first side of the isolation structure 10 and extends to cover a portion of the isolation structure 10 and a portion of the base region 130. The gate structure 20 includes a gate dielectric layer 21 and a gate 22. The gate dielectric layer 21 includes silicon oxide, silicon nitride or a dielectric material with a dielectric constant greater than 4, and can be formed with a thermal oxidation process or a chemical vapour deposition (CVD) process. The gate 22 includes polysilicon, metal, silicide or a combination thereof and can be formed with a CVD process.

The first doped region 140 of the second conductivity type (e.g. N-type heavily doped region; N$^+$ doped region) is disposed in the base region 130 and located adjacent to the gate structure 20. The fifth doped region 142 of the second conductivity type (e.g. N-type heavily doped region; N$^+$ doped region) is disposed in the substrate 100 at one side of the high-voltage doped region 126. The first doped region 140 and the fifth doped region 142 can be formed with a photolithography process and an ion implantation process. In an embodiment, the first doped region 140 and the fifth doped region 142 can be implanted with a dopant of phosphorous or arsenic, a dose of $3\times10^{15}/cm^2$ to $4\times10^{15}/cm^2$ and an energy of 70 eV to 90 eV.

The third doped region 170 of the first conductivity type (e.g. P-type heavily doped region; P$^+$ doped region) is disposed in the first well region 110 between the second side of the isolation structure 10 and the other side of the high-voltage doped region 126. The third doped region 170 can be formed with a photolithography process and an ion implantation process. In an embodiment, the third doped region 170 can be implanted with a dopant of boron, a dose of $1\times10^{15}/cm^2$ to $3\times10^{15}/cm^2$ and an energy of 50 eV to 70 eV.

The top doped region 190 of the first conductivity type (e.g. P-type doped region; P-top) is disposed below the isolation structure 10. The top doped region 190 can be formed with a photolithography process and an ion implantation process. In an embodiment, the top doped region 190 can be implanted with a dopant of boron, a dose of $5\times10^{12}/cm^2$ to $6\times10^{12}/cm^2$ and an energy of 160 eV to 180 eV.

The IGBT 200 can further include a well region 172 of the second conductivity type, a well region 168 of the second conductivity type and a well region 174 of the second conductivity type. The well region 172 is disposed in the first well region 110, and the third doped region 170 is disposed in the well region 172. The well region 168 is disposed outside of the deep doped region 120. The well region 174 is disposed in the well region 168, and the fifth doped region 142 is disposed in the well region 174. The well region 168 can be formed simultaneously during the formation of the first well region 110. The well region 172 and the well region 174 can be formed with a photolithography process and an ion implantation process. In an embodiment, the well region 172 and the well region 174 can be implanted with a dopant of phosphorous or arsenic, a dose of $1\times10^{13}/cm^2$ to $2\times10^{13}/cm^2$ and an energy of 100 eV to 120 eV. The well region 172 and the well region 174 provide the function of boosting voltage, help the hole current flow to the cathode through the first buried layer 122 and suppress generation of the substrate current.

In addition, the IGBT 200 can further include an isolation structure 11. The isolation structure is disposed on the high-voltage doped region 126 and separates the third doped region 170 from the fifth doped region 142.

The MOS 300 is disposed on the first well region 110 and the deep well region 120 at the second side of the base region 130. Specifically, the MOS 300 includes a gate structure 30, a second doped region 150 of the second conductivity type (e.g. N-type heavily doped region; N$^+$ doped region) and a sixth doped region 152 of the second conductivity type (e.g. N-type heavily doped region; N$^+$ doped region).

The gate structure 30 is disposed on the first well region 110, extends to cover another portion of the base region 130 and the high-voltage doped region 124. The gate structure 30 includes a gate dielectric layer 31 and a gate 32. The gate dielectric layer 31 includes silicon oxide, silicon nitride or a dielectric material with a dielectric constant greater than 4, and can be formed with a thermal oxidation process or a chemical vapour deposition (CVD) process. The gate 32 includes polysilicon, metal, silicide or a combination thereof and can be formed with a CVD process.

The second doped region 150 is disposed in the base region 130 at the first side of the gate structure 30. The sixth doped region 152 is disposed in the high-voltage doped region 124 at the second side of the gate structure 30. The second doped region 150 and the sixth doped region 152 can be formed with a photolithography process and an ion implantation process. In an embodiment, the second doped region 150 and the sixth doped region 152 can be implanted with a dopant of phosphorous or arsenic, a dose of $3\times10^{15}/cm^2$ to $4\times10^{15}/cm^2$ and an energy of 70 eV to 90 eV.

The MOS 300 can further include a doped region 154 of the first conductivity type. The doped region 154 is disposed in the high-voltage doped region 124, and the sixth doped region 152 is disposed in the doped region 154. The doped region 154 can be formed with a photolithography process and an ion implantation process. In an embodiment, the doped region 154 can be implanted with a dopant of boron, a dose of $2\times10^{12}/cm^2$ to $4\times10^{12}/cm^2$ and an energy of 100 eV to 140 eV.

In addition, the semiconductor device can further include a doped region 132 of the first conductivity type and a doped region 156 of the first conductivity type. The doped region 132 is disposed in the base region 130 between the second doped region 150 and the first doped region 140. The doped region 156 is disposed in the doped region 154 and located adjacent to the sixth doped region 152. The doped regions 132 and 156 can be formed with a photolithography process and an ion implantation process. In an embodiment, the doped regions 132 and 156 can be implanted with a dopant of boron, a dose of $1\times10^{12}/cm^2$ to $2\times10^{12}/cm^2$ and an energy of 50 eV to 70 eV.

The doped region 156 and the sixth doped region 152 are electrically connected to each other through a metal interconnection 52 and together serve as a base electrode. The second doped region 150, the doped region 132 and the first doped region 140 are electrically connected to each other through a metal interconnection 54 and together serve as a cathode. The third doped region 170 and the fifth doped region 142 are electrically connected to each other through a metal interconnection 56 and together serve as an anode.

The shape of the semiconductor device of the invention can be designed upon the actual requirements, such as circle, ellipse, hexagon, octagon, polygon, racetrack or a combination thereof.

In the embodiment of the present invention, the first buried layer 122 and the second buried layer 128 are disposed below the first well region 110. Therefore, when the semiconductor device is turned off, the second buried layer 128 can serve as an isolation; and when the semiconductor device is turned on, the hole current can flow to the cathode through the first buried layer 122 and suppress generation of the substrate current, and the electron current can flow to the anode through the second buried layer 128.

Moreover, in the embodiment of the present invention, the MOS 300 is provided in the semiconductor device. Therefore, when the semiconductor device is turned on, a double-diffused metal oxide semiconductor (DMOS) channel is formed below the gate structure 30, thereby increasing the cathode (on-state) current and further reducing or eliminating the substrate current.

Besides, in the semiconductor device of the present invention, the base region 130 is not connected to the deep doped region 120. Therefore, when the semiconductor device is turned on, a channel of the second conductivity type is formed in the first well region 110 between the base region 130 and the deep doped region 120 and below the cathode. Accordingly, the electron current generated by the MOS 300 can flow through the said channel instead of the underlying second buried layer 128 to turn on the MOS 300. Therefore, the electron current path can be reduced, the on-state resistance of the MOS 300 can be decreased, and the on-state current can be increased. In other words, in the semiconductor device of the present invention, the channel of the second conductivity type can be provided between the base region 130 and the deep doped region 120. Thus, the semiconductor device of the invention is a high-voltage multi-channel device with high electron injection.

Furthermore, when the semiconductor device is turned off, the first buried layer 122, the second buried layer 128, the first well region 110 and the top doped region 190 form a multiple reduced surface field (multi-RESURF) structure to enhance the breakdown voltage.

Figure 2:
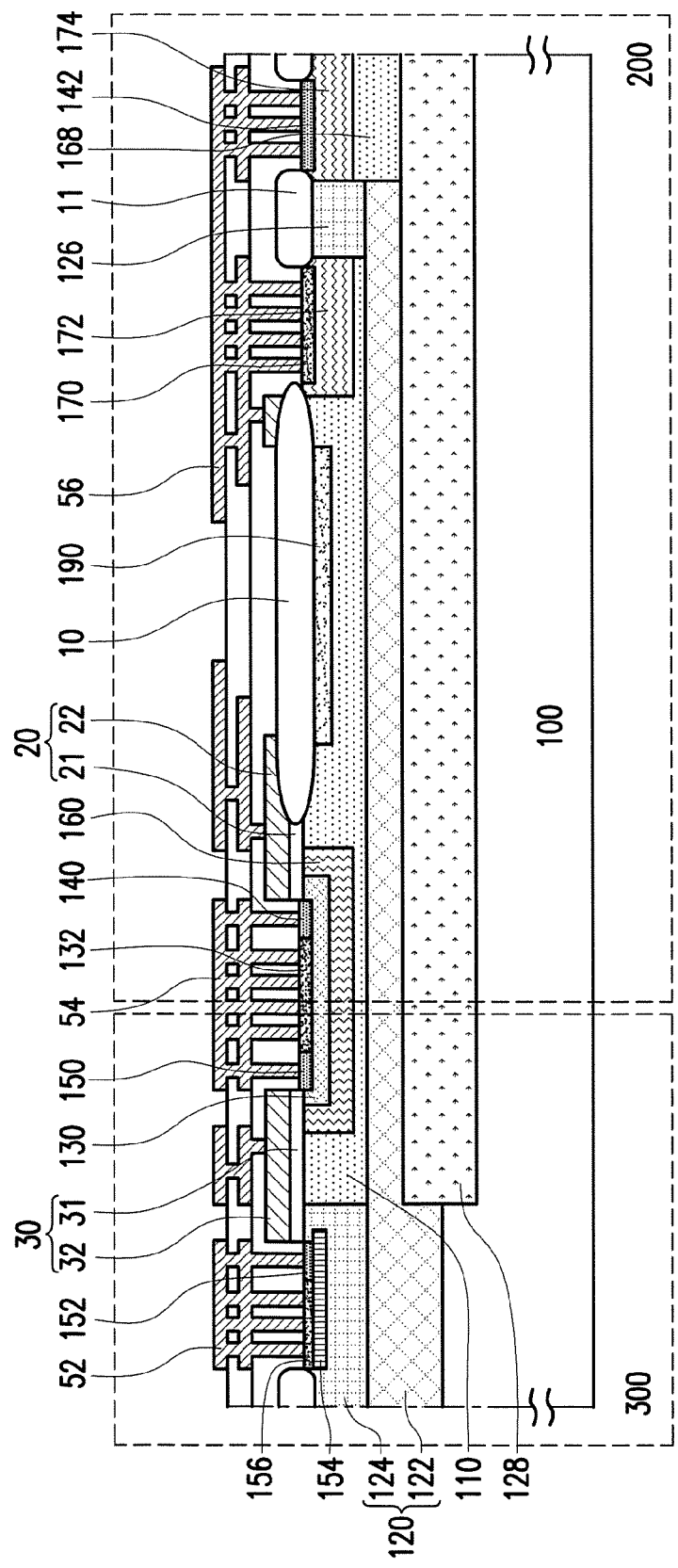
FIG. 2 is a schematic cross-sectional view of a semiconductor device according to a second embodiment of the present invention.

FIG. 2 is a schematic cross-sectional view of a semiconductor device according to a second embodiment of the present invention.

As shown in FIG. 2, the semiconductor device of second embodiment is similar to that of the first embodiment, and the difference lies in that the semiconductor device of second embodiment further includes a second well region 160 of the second conductivity type (e.g. N-type well region). The second well region 160 is disposed in the first well region 110, and the base region 130 is disposed in the second well region 160. The second well region 160 can be formed with a photolithography process and an ion implantation process. In an embodiment, the second well region 160 can be implanted with a dopant of phosphorous or arsenic, a dose of $1\times10^{13}/cm^2$ to $2\times10^{13}/cm^2$ and an energy of 100 eV to 120 eV. The second well region 160 has a doping concentration greater than that of the first well region 110, so as to effectively reduce the resistance therein and increase the on-state current.

Figure 3:
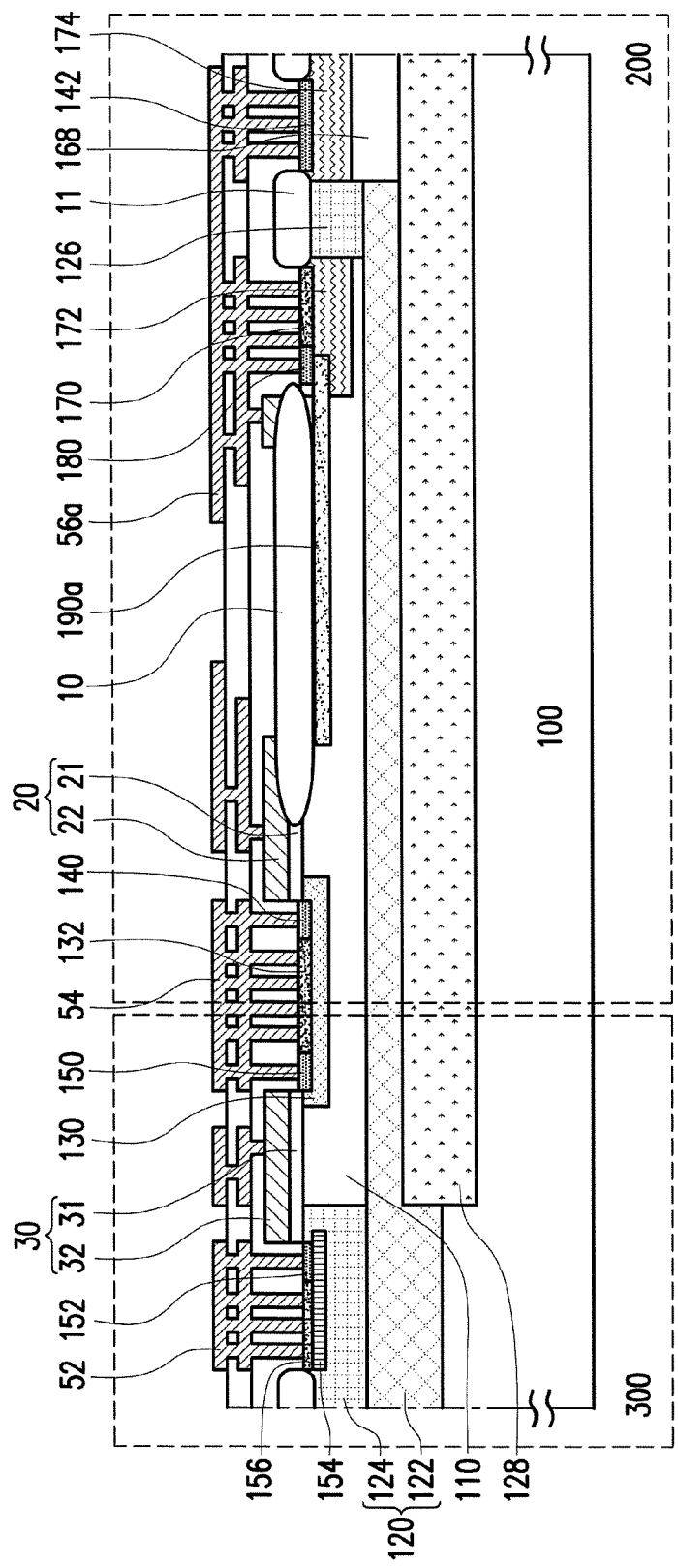
FIG. 3 is a schematic cross-sectional view of a semiconductor device according to a third embodiment of the present invention.

FIG. 3 is a schematic cross-sectional view of a semiconductor device according to a third embodiment of the present invention.

As shown in FIG. 3, the semiconductor device of third embodiment is similar to that of the first embodiment, and the difference lies in that the IGBT 200 of the semiconductor device of third embodiment further includes a fourth doped region 180 of the second conductivity type (e.g. N-type heavily doped region; $N^+$ doped region). The fourth doped region 180 is disposed in the well region 172 between the third doped region 170 and the isolation structure 10 and located adjacent to the third doped region 170. Besides, the fourth doped region 180, the third doped region 170 and the fifth doped region 142 are electrically connected to each other through a metal interconnection 56a and together serve as an anode. Besides, the top doped region 190a extends from below the isolation structure 10 to below the fourth doped region 180 and contacts the fourth doped region 180. The fourth doped region 180 can be formed with a photolithography process and an ion implantation process. In an embodiment, the fourth doped region 180 can be implanted with a dopant of phosphorous or arsenic, a dose of $3\times10^{15}/cm^2$ to $4\times10^{15}/cm^2$ and an energy of 70 eV to 90 eV.

In the third embodiment, the top doped region 190a extends from below the isolation structure 10 to below the fourth doped region 180 and contacts the fourth doped region 180. Therefore, when the semiconductor device is turned on, the hole current can flow through the first buried layer 122 (e.g. PBL) and/or the top doped region 190a and therefore increase the on-state current. Besides, the fourth doped region 180 (e.g. $N^+$ doped region) and the well region 172 provide the function of boosting voltage and create a multi-RESURF structure, and thus, punch through and therefore serious leakage current can be avoided.

Figure 4:
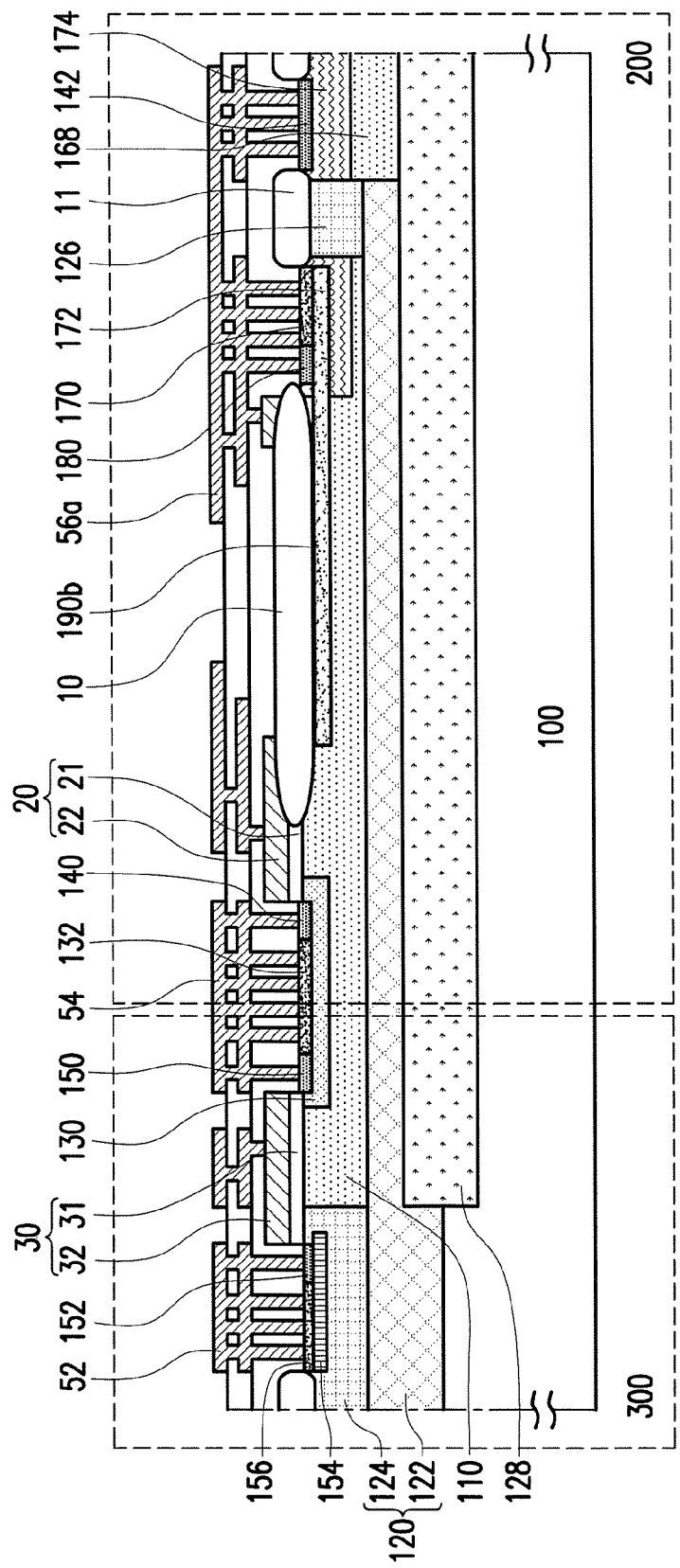
FIG. 4 is a schematic cross-sectional view of a semiconductor device according to a fourth embodiment of the present invention.

FIG. 4 is a schematic cross-sectional view of a semiconductor device according to a fourth embodiment of the present invention.

As shown in FIG. 4, the semiconductor device of fourth embodiment is similar to that of the third embodiment, and the difference lies in that the top doped region 190b extends from below the isolation structure 10 to below the third doped region 170 and contacts the third and fourth doped regions 170 and 180. In the fourth embodiment, with such disposition of the top doped region 190b, when the semiconductor device is turned on, the hole current can flow through the first buried layer 122 (e.g. PBL) and/or the top doped region 190b and therefore increase the on-state current.

Figure 5:
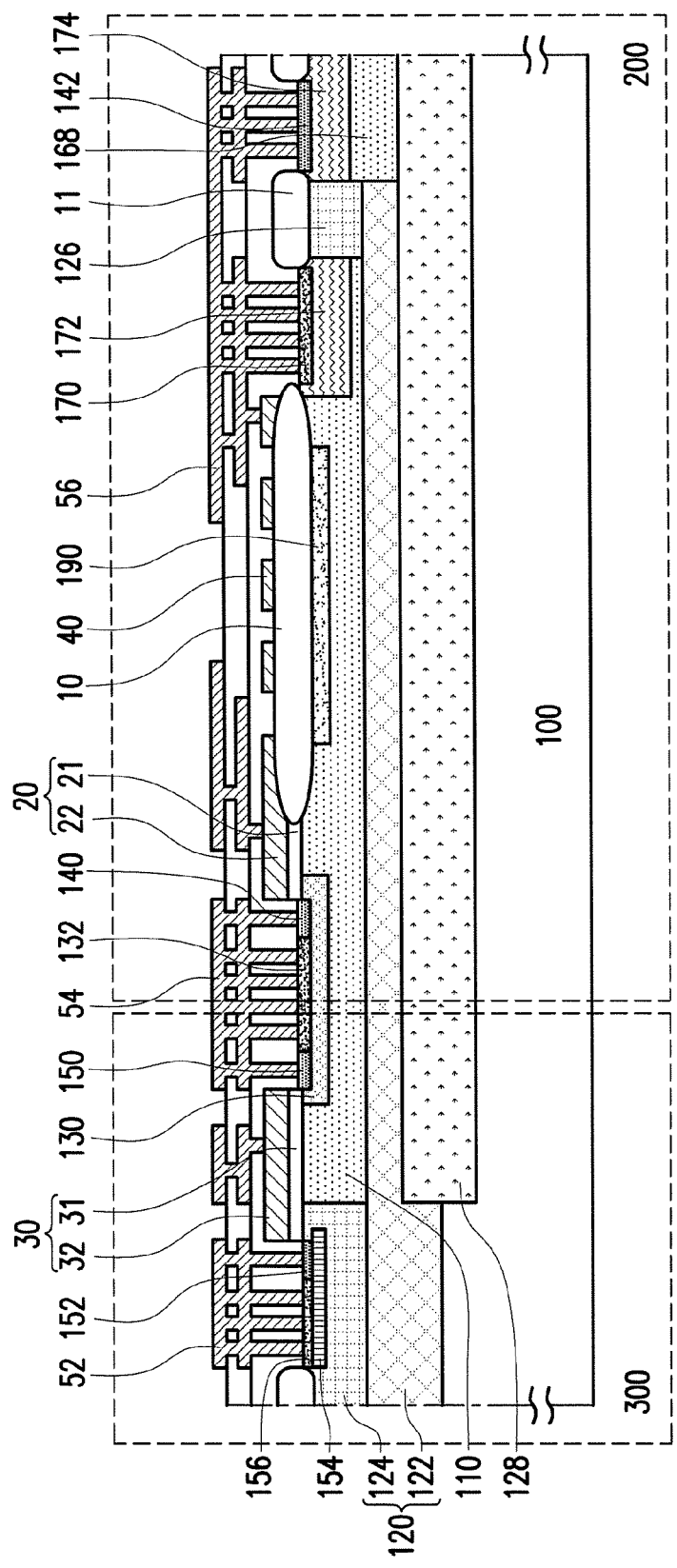
FIG. 5 is a schematic cross-sectional view of a semiconductor device according to a fifth embodiment of the present invention.

FIG. 5 is a schematic cross-sectional view of a semiconductor device according to a fifth embodiment of the present invention.

As shown in FIG. 5, the semiconductor device of fifth embodiment is similar to that of the first embodiment, and the difference lies in that the semiconductor device of fifth embodiment further includes at least one field plate 40 disposed on the isolation structure 10. The field plate 40 includes polysilicon, metal, silicide or a combination thereof. The method of forming the field plate 40 includes depositing a field plate material layer with CVD or PVD, and then patterning the field plate material layer with photolithography and etching processes. The CVD includes a plasma enhanced CVD (PECVD) or a low pressure CVD. The PVD includes evaporating, sputtering or ion beam deposition. With the disposition of the field plate 40, the electric field within the semiconductor device can be distributed uniformly to enhance the breakdown voltage. In other words, under the same breakdown voltage, the isolation structure 10 can be scaled down and therefore the requirement for device minimization can be met.

Figure 6:
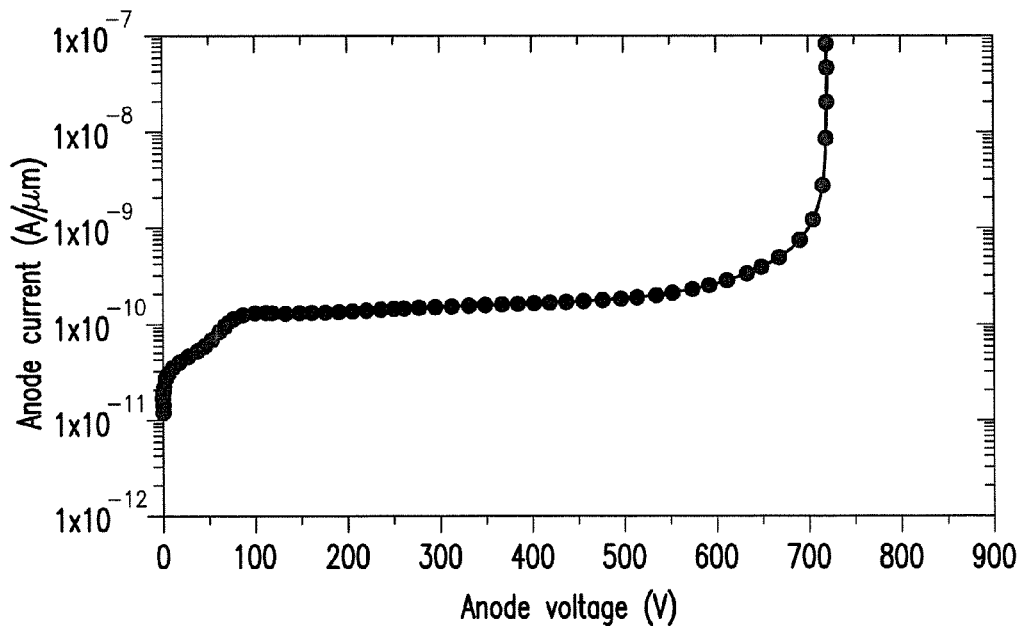
FIG. 6 is a graph of anode current vs. anode voltage when the semiconductor device of the invention is turned off.
Figure 7:
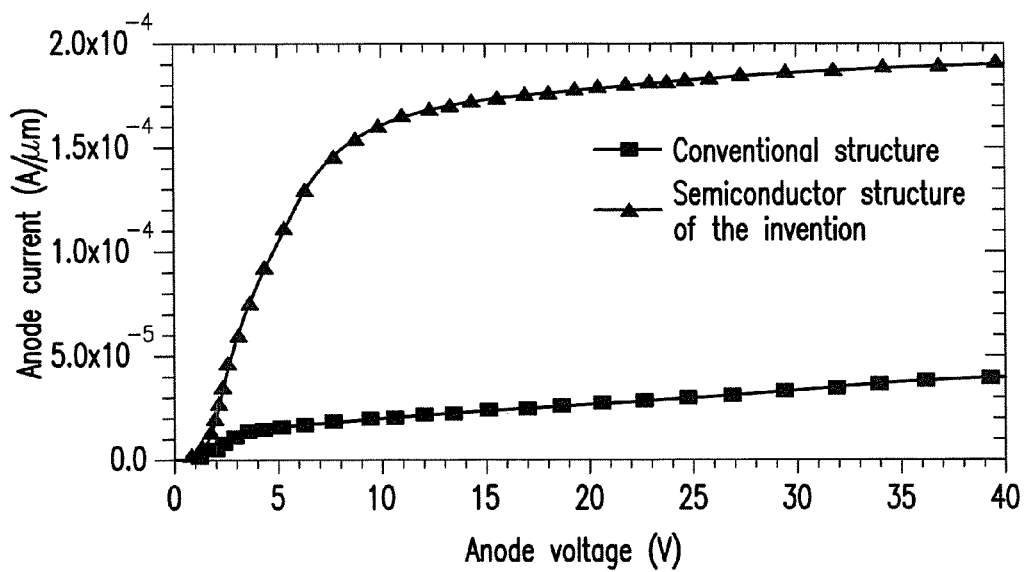

FIG. 6 is a graph of anode current vs. anode voltage when the semiconductor device of the invention is turned off. FIG. 7 is a graph of anode current vs. anode voltage when the semiconductor device of the invention and the conventional IGBT are turned on.

Referring to FIG. 6 and FIG. 7, under the same anode voltage, the anode current generated by the semiconductor device of the invention is higher than that generated by the conventional IGBT. Besides, the semiconductor device of the present invention can withstand high voltage up to 700 volts.

In summary, the semiconductor device of the invention is provided with a lower on-state resistance, a higher on-state current and a stable higher breakdown voltage, and thus, the less power consumption and better product reliability of the product can be achieved. In other words, the semiconductor device of the present invention has the advantages of both IGBT and MOS. Besides, the semiconductor device of the invention can be fabricated with the existing 700 V CMOS process. In addition, the semiconductor device of the invention can be applied to energy smart products, such as motor drivers, LED drivers or current drivers.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A semiconductor device, comprising:
    a deep doped region of a first conductivity type, comprising a first buried layer and two high-voltage doped regions and disposed in a substrate;
    a first well region of a second conductivity type, disposed in the deep doped region;
    a base region of the first conductivity type, disposed in the first well region and not connected to the deep doped region;
    an insulated gate bipolar transistor (IGBT), disposed on the first well region at a first side of the base region, and comprising a first doped region of the second conductivity type disposed in the base region; and
    a metal oxide semiconductor (MOS), disposed on the first well region and the deep well region at a second side of the base region, and comprising a second doped region of the second conductivity type disposed in the base region.

2. The semiconductor device of claim 1, further comprising a second buried layer of the second conductivity type disposed between the first buried layer and the substrate.

3. The semiconductor device of claim 1, further comprising a second well region of the second conductivity type disposed in the first well region, wherein the base region is located in the second well region.

4. The semiconductor device of claim 1, wherein the IGBT further comprises:
    an isolation structure, disposed in the first well region;
    a gate structure, disposed on the first well region at a first side of the isolation structure, covering a portion of the isolation structure and a portion of the base region, and located adjacent to the first doped region;
    a third doped region of the first conductivity type, disposed in the first well region at a second side of the isolation structure;
    a fourth doped region of the second conductivity type, disposed in the first well region between the third doped region and the isolation structure and contacting the third doped region; and
    a top doped region of the first conductivity type, disposed below the isolation structure.

5. The semiconductor device of claim 4, wherein the top doped region extends from below the isolation structure to below the fourth doped region and contacts the fourth doped region.

6. The semiconductor device of claim 4, wherein the top doped region extends from below the isolation structure to below the third doped region and contacts the third and fourth doped regions.

7. The semiconductor device of claim 4, wherein the gate structure comprises polysilicon, metal, silicide or a combination thereof.

8. The semiconductor device of claim 4, further comprising at least one field plate disposed on the isolation structure.

9. The semiconductor device of claim 8, wherein the field plate comprises polysilicon, metal, silicide or a combination thereof.

10. The semiconductor device of claim 1, wherein the first conductivity type is N-type and the second conductivity type is P-type, or the first conductivity type is P-type and the second conductivity type is N-type.

11. A method of fabricating a semiconductor device, comprising:
    forming a deep doped region of a first conductivity type in a substrate, the deep doped region comprising a first buried layer and two high-voltage doped regions;
    forming a first well region of a second conductivity type in the deep doped region;
    forming a base region of the first conductivity type in the first well region, the base region being not connected to the deep doped region;
    forming an insulated gate bipolar transistor (IGBT) on the first well region at a first side of the base region, comprising forming a first doped region of the second conductivity type in the base region; and
    forming a metal oxide semiconductor (MOS) on the first well region and the deep well region at a second side of the base region, comprising forming a second doped region of the second conductivity type in the base region.

12. The method of claim 11, further comprising forming a second buried layer of the second conductivity type between the first buried layer and the substrate.

13. The method of claim 11, further comprising forming a second well region of the second conductivity type in the first well region, wherein the base region is located in the second well region.

14. The method of claim 11, wherein the step of forming the IGBT further comprises:
forming an isolation structure in the first well region;
forming a gate structure on the first well region at a first side of the isolation structure, the gate structure covering a portion of the isolation structure and a portion of the base region and located adjacent to the first doped region;
forming a third doped region of the first conductivity type in the first well region at a second side of the isolation structure;
forming a fourth doped region of the second conductivity type in the first well region between the third doped region and the isolation structure, the fourth doped region contacting the third doped region; and
forming a top doped region of the first conductivity type below the isolation structure.

15. The method of claim 14, wherein the top doped region extends from below the isolation structure to below the fourth doped region and contacts the fourth doped region.

16. The method of claim 14, wherein the top doped region extends from below the isolation structure to below the third doped region and contacts the third and fourth doped regions.

17. The method of claim 14, wherein the isolation structure comprises a field oxide (FOX) structure, a shallow trench isolation (STI) structure or a deep trench isolation structure.

18. The method of claim 14, further comprising forming at least one field plate on the isolation structure.

19. The method of claim 18, wherein the field plate comprises polysilicon, metal, silicide or a combination thereof.

20. The method of claim 11, wherein the first conductivity type is N-type and the second conductivity type is P-type, or the first conductivity type is P-type and the second conductivity type is N-type.

* * * * *